United States Patent
Wang et al.

(10) Patent No.: US 7,564,686 B2
(45) Date of Patent: Jul. 21, 2009

(54) HEAT-DISSIPATING MODULE

(75) Inventors: Feng-Ku Wang, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/851,107

(22) Filed: Sep. 6, 2007

(65) Prior Publication Data

US 2009/0034195 A1 Feb. 5, 2009

(30) Foreign Application Priority Data

Jul. 30, 2007 (TW) ............... 96127749 A

(51) Int. Cl.
*H05K 7/20* (2006.01)
*F28F 7/00* (2006.01)
(52) U.S. Cl. .................. 361/700; 165/104.33; 361/703; 361/695
(58) Field of Classification Search ............ 165/104.33, 165/121; 361/700, 703, 694, 695
See application file for complete search history.

(56) References Cited

U.S. PATENT DOCUMENTS

| | | | |
|---|---|---|---|
| 6,698,505 B2 * | 3/2004 | Lopatinsky et al. ......... 165/122 |
| 6,779,595 B1 * | 8/2004 | Chiang .................. 165/104.33 |
| 6,867,691 B2 * | 3/2005 | Nishimura .................. 340/439 |
| 7,117,928 B2 * | 10/2006 | Chen ......................... 165/80.3 |
| 7,289,322 B2 * | 10/2007 | Chen et al. .................... 361/695 |
| 2006/0098414 A1 * | 5/2006 | Huang ........................ 361/709 |
| 2007/0121291 A1 * | 5/2007 | Wang et al. .................. 361/695 |
| 2007/0251675 A1 * | 11/2007 | Hwang et al. .......... 165/104.33 |
| 2007/0251676 A1 * | 11/2007 | Cheng et al. ........... 165/104.33 |
| 2008/0093056 A1 * | 4/2008 | Hwang et al. .......... 165/104.33 |
| 2008/0151500 A1 * | 6/2008 | Liang et al. ................. 361/697 |

* cited by examiner

*Primary Examiner*—Gregory D Thompson
(74) *Attorney, Agent, or Firm*—J.C. Patents

(57) ABSTRACT

A heat-dissipating module dissipating heat generated by a heat-generating element includes a plurality of fins, a fan generating an air current and a heat pipe. Each fin has a first edge facing the fan and a second edge facing the fan. The first edges are located on a first surface. The second edges are located on a second surface not coinciding with the first surface. The air current passing through the first and second surfaces passes by the fins. A first end of the heat pipe is thermally coupled to the heat-generating element. A second end of the heat pipe is thermally coupled to the fins.

8 Claims, 7 Drawing Sheets

HEAT-DISSIPATING MODULE

CROSS-REFERENCE TO RELATED APPLICATION

This application claims the priority benefit of Taiwan application serial no. 96127749, filed on Jul. 30, 2007. All disclosure of the Taiwan application is incorporated herein by reference.

BACKGROUND OF THE INVENTION

1. Field of the Invention

The present invention relates to a heat-dissipating module. More particularly, the present invention relates to a heat-dissipating module having fins.

2. Description of Related Art

Recently, as the rapid development of computer science and technology, the operation speed of the computer is continuously increased, and the heat generation rate of electronic elements within the host is continuously increased. In order to prevent the electronic elements within the host from becoming excessively hot to result in temporary or permanent failure, heat dissipation performed to the electronic elements within the host plays an important role.

Taking the central processing unit (CPU) as an example, under a high speed operation, once the temperature of the CPU itself exceeds a normal operation temperature scope, an operation error or a temporary failure extremely possibly occurs in the CPU and thus the computer host crashes. In addition, if the temperature of the CPU is much higher than the normal operation temperature, even it is extremely possible to damage the transistors in the CPU, so as to result in the permanent failure of the CPU.

FIG. 1A is a three-dimensional exploded view of a conventional heat-dissipating module, and FIG. 1B is a three-dimensional assembled view of the heat-dissipating module of FIG. 1A. Referring to FIGS. 1A and 1B, a conventional heat-dissipating module 100 is suitable for dissipating heat generated by a heat-generating element 10. The heat-dissipating module 100 includes a fin module 110, a fan 120, a heat pipe 130, a casing 140 and a heat-conducting element 150. The fin module 100 has a plurality of fins 114, and each fin 114 has a straight edge 114a facing the fan 120. The edges 114a are located on a plane 112. The fan 120 is disposed in an accommodating space 142 of the casing 140, and located near the plane 112.

An outlet 114 of the casing 140 corresponds to the plane 112, and an air current 122 generated by the fan 120 passes through the outlet 144 and the plane 112, so as to enter a clearance 116 kept by each two neighboring fins 114. In addition, a first end 132 of the heat pipe 130 is thermally coupled to the heat-generating element 10 via the heat-conducting element 150, and a second end 134 of the heat pipe 130 penetrates through the fins 114 and is thermally coupled to the fins 114.

As the computer is miniaturized, the space occupied by the heat-dissipating module 100 in the computer gradually becomes smaller. However, the minimum distance between the fan 120 and the plane 112 must be maintained to be larger than a preset value, otherwise, when the fan 120 operates, a turbulence phenomenon at the plane 112 becomes more serious such that larger noises are generated. Therefore, the conventionally adopted solution for meeting the requirement of miniaturizing the heat-dissipating module 100 without increasing the noise is to reduce the size of the fan 120 or to shorten the length 114b of each fin 114. No matter which solution is adopted, a heat-dissipating capacity of the conventional heat-dissipating module 100 will be lowered.

SUMMARY OF THE INVENTION

Accordingly, the present invention is directed to a heat-dissipating module, capable of making lower noises and having desirable heat-dissipating capacity.

The present invention provides a heat-dissipating module, suitable for dissipating heat generated by a heat-generating element. The heat-dissipating module includes a plurality of fin, a fan and a heat pipe. The fan is suitable for generating an air current. Each fin has a first edge facing the fan and a second edge facing the fan. The first edges are located on a first surface, and the second edges are located on a second surface not coinciding with the first surface. The air current passing through the first surface and the second surface and then passes by the fins. A first end of the heat pipe is thermally coupled to the heat-generating element, and a second end of the heat pipe is thermally coupled to the fins.

In an embodiment of the present invention, each first edge may have a regular shape. In addition, each first edge may have a straight shape, an arc shape, a serrated shape, or a wavy shape.

In an embodiment of the present invention, each second edge may have a regular shape. In addition, each second edge may have a straight shape, an arc shape, a serrated shape, or a wavy shape.

In an embodiment of the present invention, the heat-dissipating module further includes a heat-conducting element thermally coupled to the heat-generating element, and the first end of the heat pipe is thermally coupled to the heat-conducting element.

In an embodiment of the present invention, the heat-dissipating module further includes a casing having an accommodating space and an outlet. The fan is disposed in the accommodating space, the outlet corresponds to the first surface and the second surface, and the air current passes through the outlet.

In an embodiment of the present invention, the second end of the heat pipe may penetrate through the fins.

Since the first surface is not coincided with the second surface, the air current may smoothly pass through the first surface and the second surface and then pass by the fins when the heat-dissipating module of the present invention operates. In other words, the air current firstly passes by the first edge of each fin, and then passes by the second edge of each fin. Therefore, when the heat-dissipating module of the present invention operates, the turbulence phenomenon at the first surface is reduced, such that the noise caused by the turbulence is lowered.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
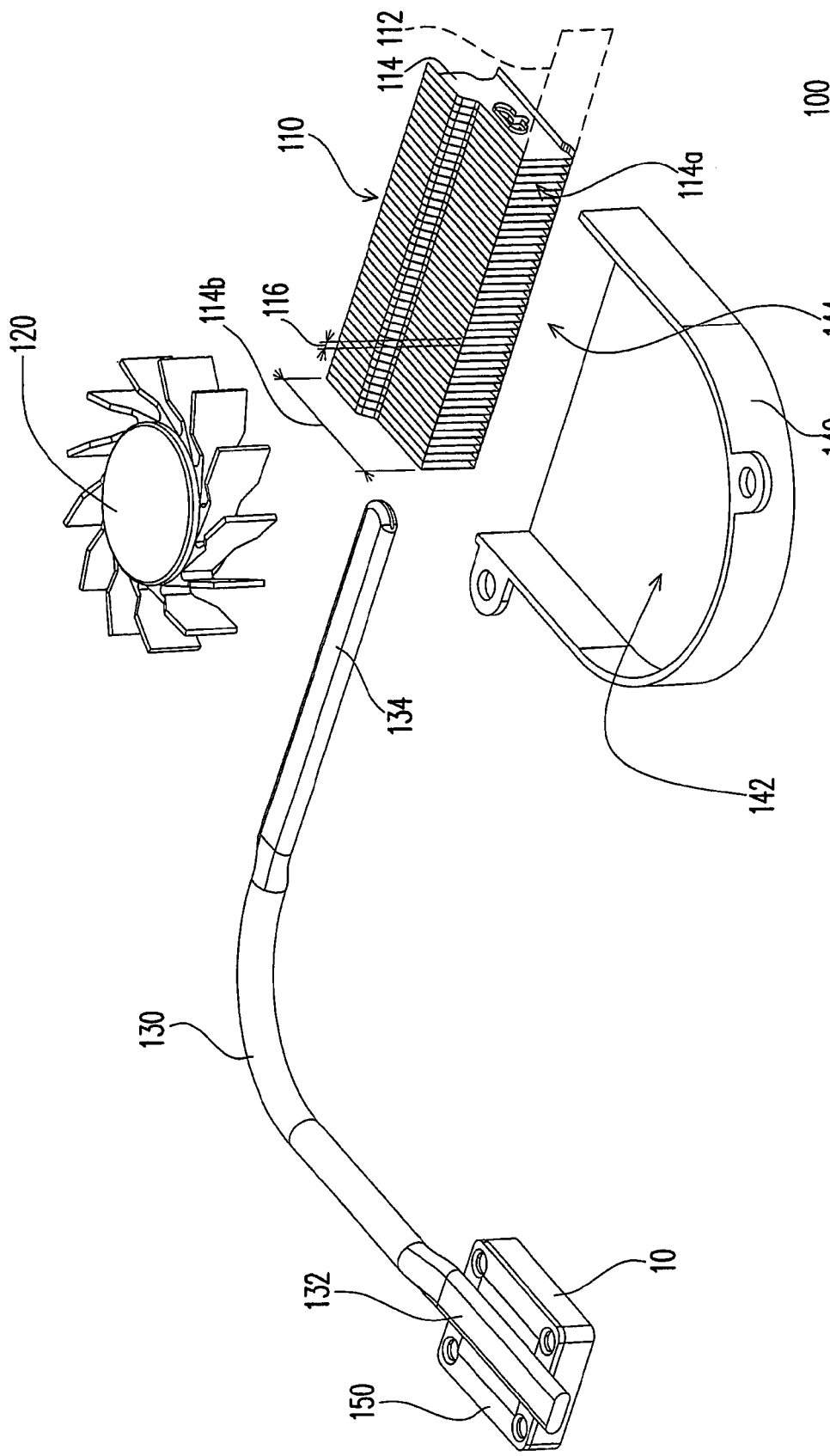
FIG. 1A is a three-dimensional exploded view of a conventional heat-dissipating module.
Figure 1B:
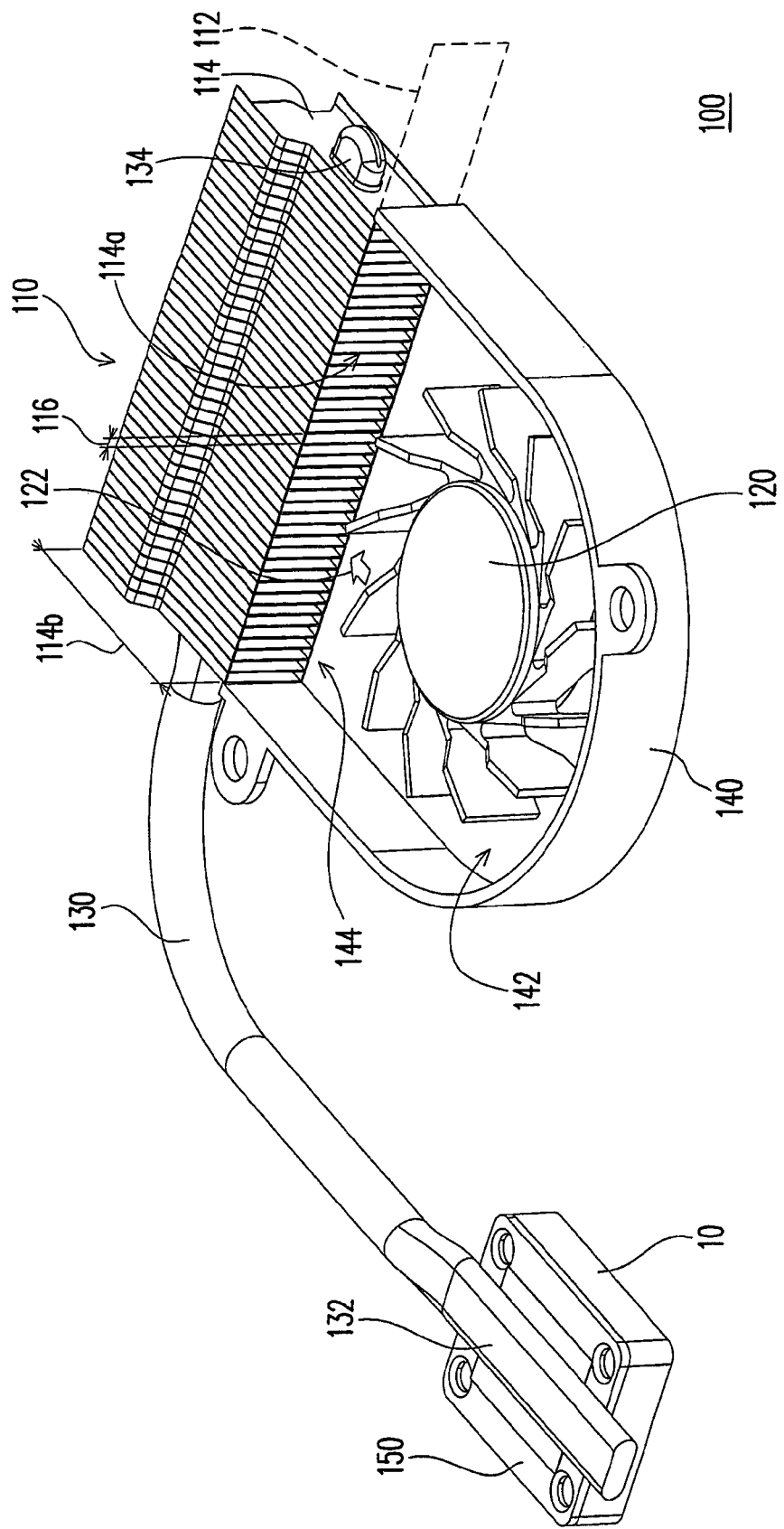
FIG. 1B is a three-dimensional assembled view of the heat-dissipating module of FIG. 1A.
Figure 2A:
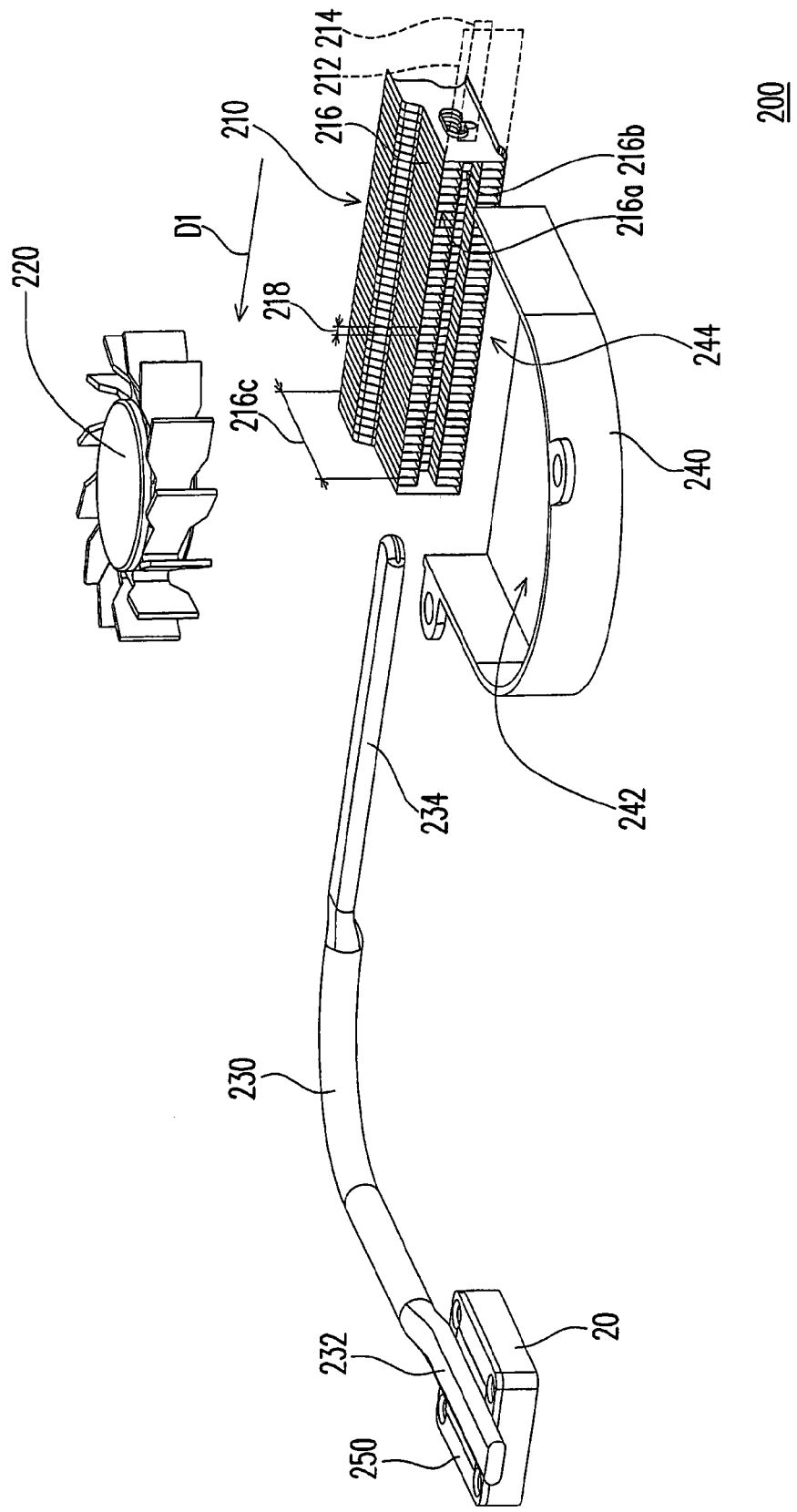
FIG. 2A is a three-dimensional exploded view of a heat-dissipating module according to a first embodiment of the present invention.
Figure 2B:
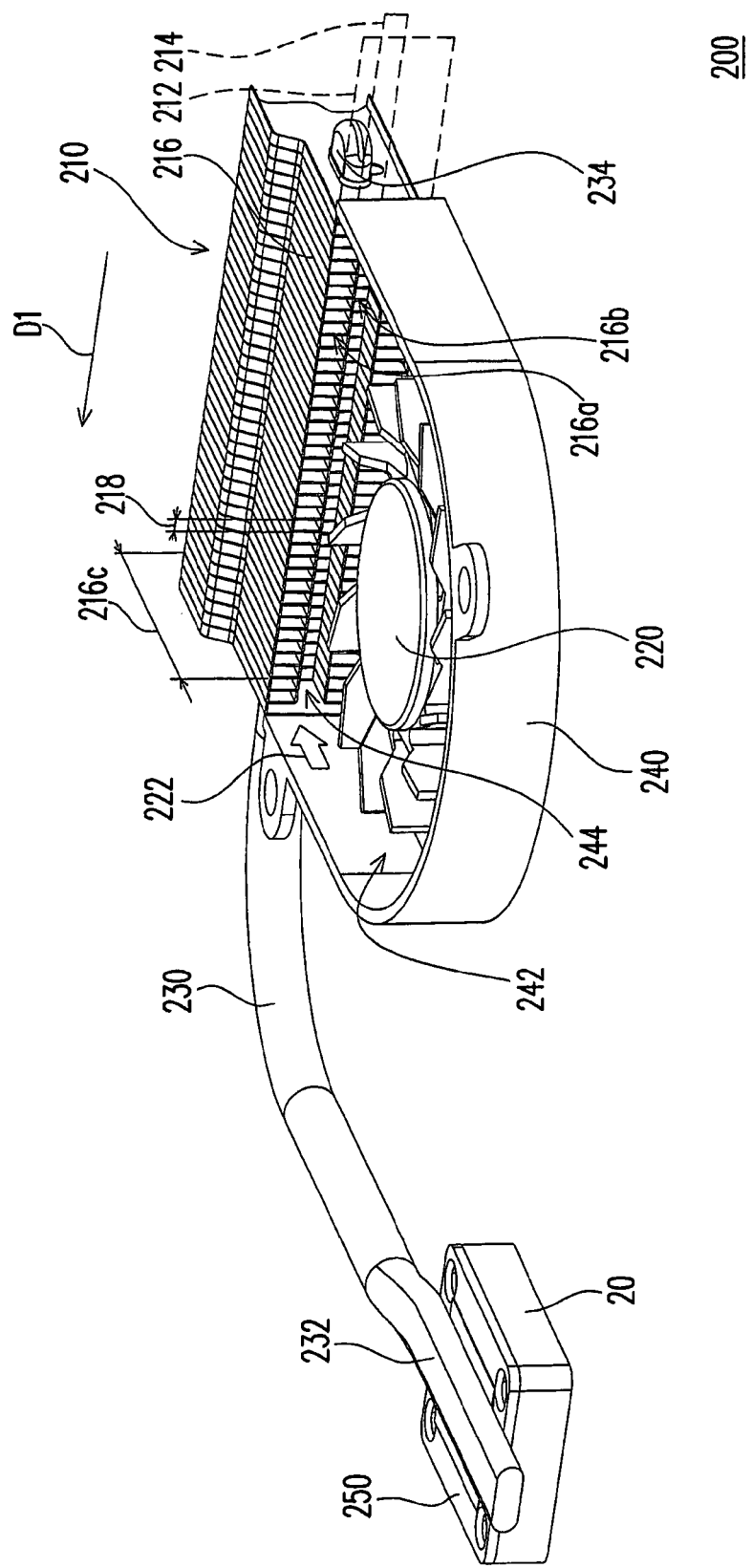
FIG. 2B is a three-dimensional assembled view of the heat-dissipating module of FIG. 2A.
Figure 2C:
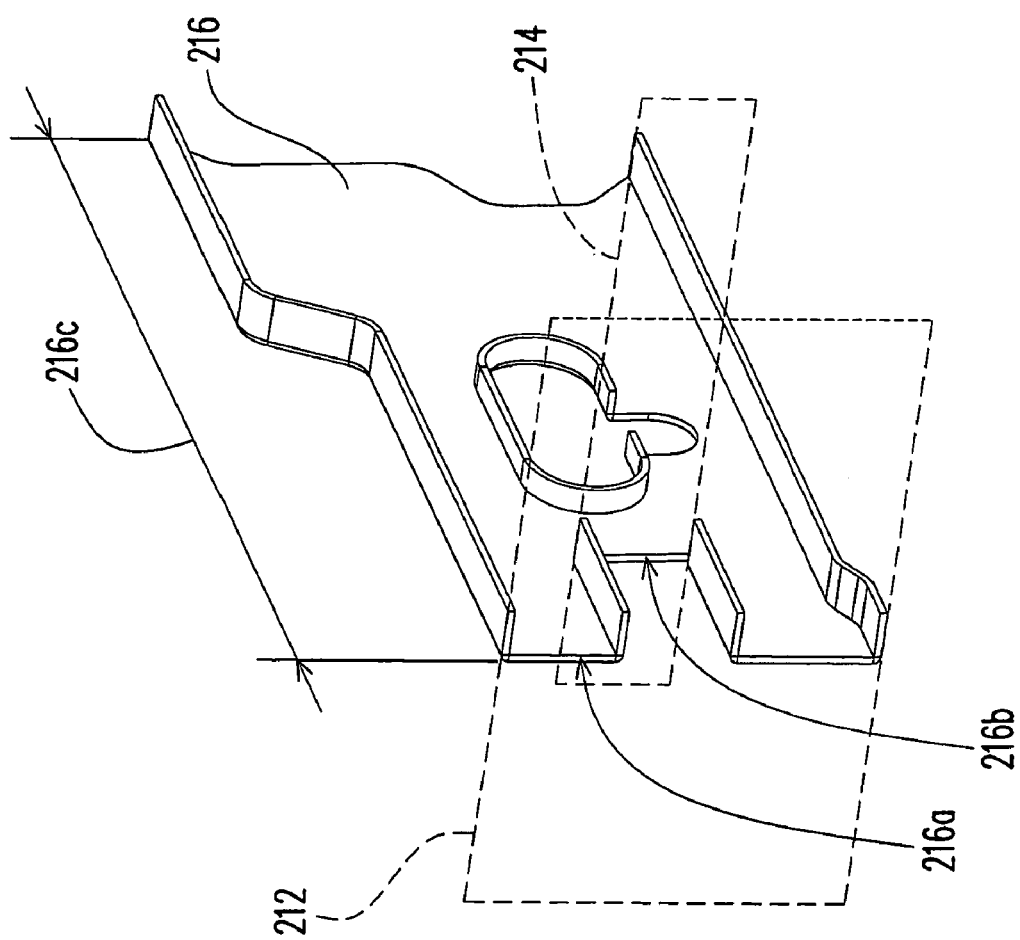
FIG. 2C is a three-dimensional view of the fin of FIG. 2A.

FIG. 2A is a three-dimensional exploded view of a heat-dissipating module according to the first embodiment of the present invention, FIG. 2B is a three-dimensional assembled view of the heat-dissipating module of FIG. 2A, and FIG. 2C is a three-dimensional view of the fin of FIG. 2A. It should be mentioned herein that, for the convenience of illustration, a first surface 212 and a second surface 214 as shown in FIGS. 2A and 2B extend out of the fin module 210, so as to clearly show the relative position between the first surface 212 and the second surface 214.

Referring to FIGS. 2A, 2B, and 2C, a heat-dissipating module 200 of the first embodiment is suitable for dissipating heat generated by a heat-generating element 20. The heat-dissipating module 200 includes a fin module 210, a fan 220 and a heat pipe 230. The fin module 210 has a plurality of fins 216. Each fin 216 has a first edge 216a facing the fan 220 and a second edge 216b facing the fan 220. The first edges 216a are located on a first surface 212, and the second edges 216b are located on a second surface 214 not coinciding with the first surface 212.

The fan 220, disposed adjacent to the first surface 212, is suitable for generating an air current 222. The air current 222 passing through the first surface 212 and the second surface 214 and then passes by the fins 216. In this embodiment, the air current 222 firstly passes through the first surface 212, and then passes through the second surface 214, so as to enter a clearance 218 kept by each two neighboring fins 216. A first end 232 of the heat pipe 230 is thermally coupled to the heat-generating element 20, and a second end 234 of the heat pipe 230 penetrates through the fins 216 and is thermally coupled to the fins 216.

The present electronic device (for example, computer) is miniaturized and the space occupied by the heat-dissipating module 200 in the electronic device becomes increasingly small, and the designer requires that the minimum distance between the fan 220 and the first surface 212 must be kept to be larger than a preset value. Because the first surface 212 is not coincided with the second surface 214, the air current 222 may smoothly pass through the first surface 212 and the second surface 214 and then enters into the clearances 218 when the heat-dissipating module 200 of this embodiment operates.

In other words, the air current 222 firstly passes by the first edge 216a of each fin 216, and then passes by the second edge 216b of each fin 216. Therefore, when the heat-dissipating module 200 of this embodiment operates, the turbulence phenomenon at the first surface 212 is reduced, such that the noise caused by the turbulence is lowered.

In addition, unlike the conventional heat-dissipating module, it is unnecessary to reduce the size of the fan 220 of the heat-dissipating module 200 of the present embodiment and to completely reduce the length 216c of each fin 216 of the heat-dissipating module 200 of the present embodiment. Therefore, the heat-dissipating capacity of the heat-dissipating module 200 of the present embodiment may be good.

In this embodiment, each first edge 216a may have a regular shape and each second edge 216b may have a regular shape. Particularly, the fins 216 are arranged in the direction D1 and the direction D1 is vertical to a maximum heat-dissipating surface of each fin 216. As viewed along the direction D1, each first edge 216a may have a straight shape and each second edge 216b may have a straight shape. In other words, the first surface 212 may be a plane, the second surface 214 may be a plane, and they are not coplanar. However, each first edge 216a and each second edge 216b may have other regular shapes depending upon the demands of the designer, which is further described below in detail.

In this embodiment, the heat-dissipating module 200 further includes a casing 240 and a heat-conducting element 250. The casing 240 has an accommodating space 242 and an outlet 244. The fan 220 is disposed in the accommodating space 242, the outlet 244 corresponds to the first surface 212 and the second surface 214, and the air current 222 passes through the outlet 244. The heat-conducting element 250 is thermally coupled to the heat-generating element 20, and the first end 232 of the heat pipe 230 is thermally coupled to the heat-conducting element 250.

Second Embodiment

Figure 3A:
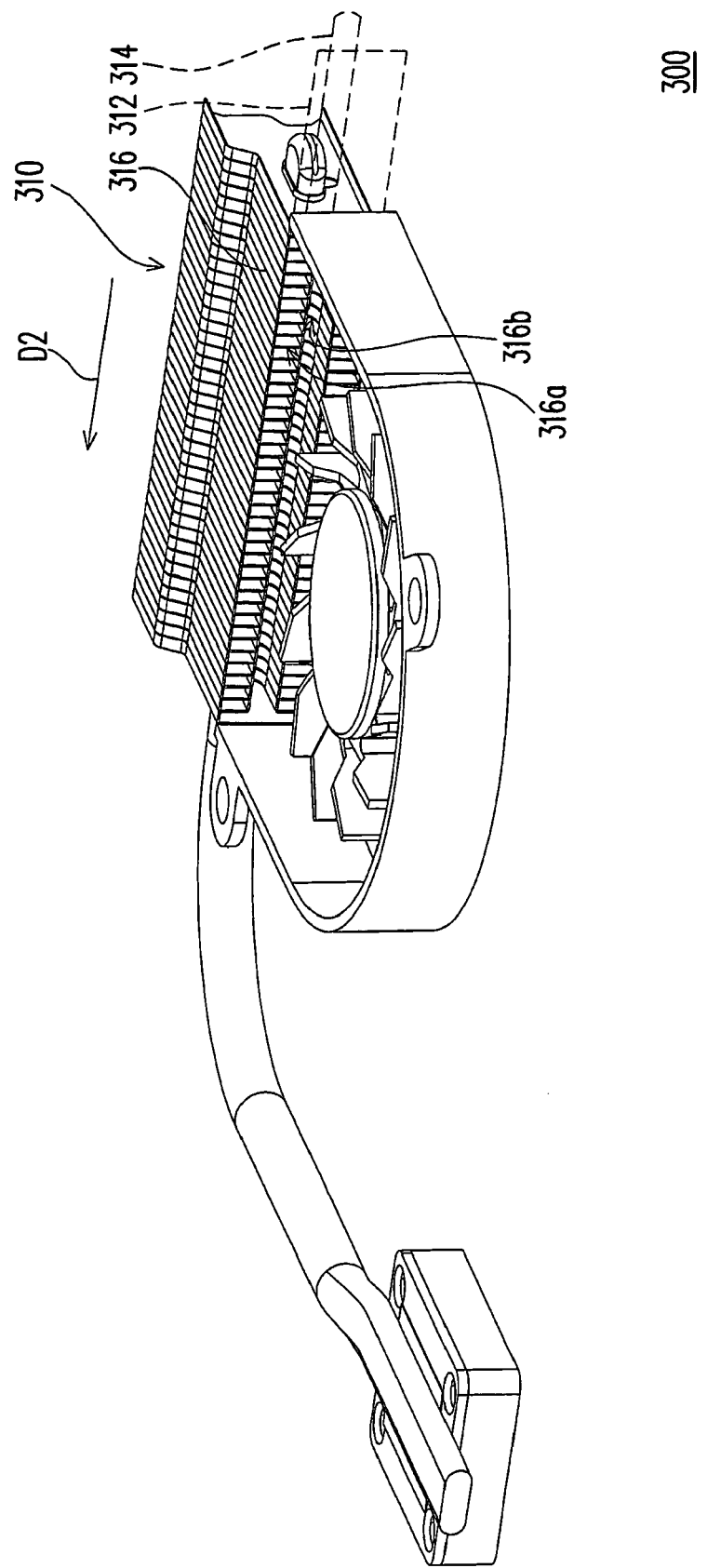
FIG. 3A is a three-dimensional view of a heat-dissipating module according to a second embodiment of the present invention.
Figure 3B:
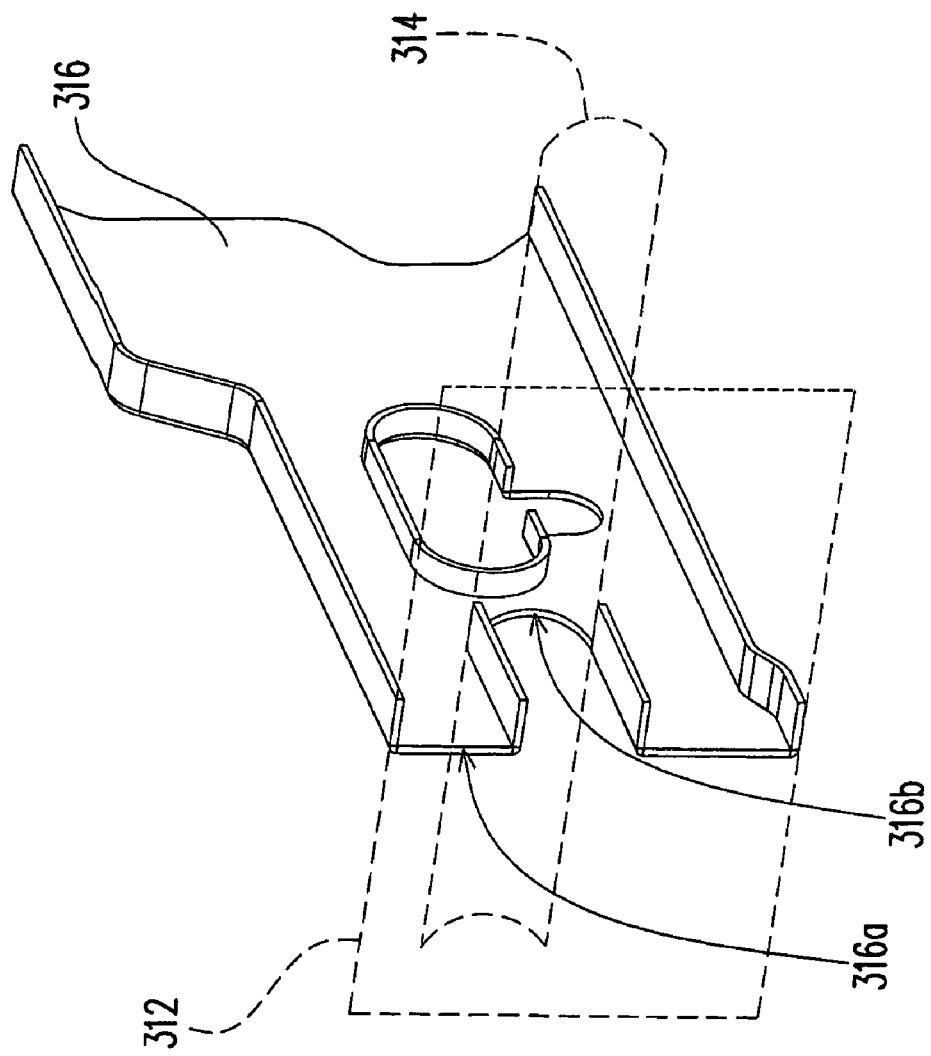
FIG. 3B is a three-dimensional view of the fin of FIG. 3A.

FIG. 3A is a three-dimensional view of a heat-dissipating module according to a second embodiment of the present invention, and FIG. 3B is a three-dimensional view of the fin of FIG. 3A. It must be mentioned herein that, for the convenience of illustration, a first surface 312 and a second surface 314 as shown in FIG. 3A must extend out of a fin module 310, so as to clearly show the relative position between the first surface 312 and the second surface 314.

Referring to FIGS. 3A and 3B, the fins 316 are arranged in the direction D2 and the direction D2 is vertical to a maximum heat-dissipating surface of each fin 316. The main difference between a heat-dissipating module 300 of the second embodiment and the heat-dissipating module 200 of the first embodiment lies in that, as viewed along the direction D2, each first edge 316a may have a straight shape, and each second edge 316b may have an arc shape. In other words, the first surface 312 where each first edge 316a is located may be a plane, and the second surface 314 where each second edge 316b is located may be a cambered surface. However, the first surface 312 is not coincided with the second surface 314.

Here, it must be mentioned that each first edge 316a may have an arc shape, and each second edge 316b may have a straight shape. Alternatively, each first edge 316a may have an arc shape, each second edge 316b may have an arc shape. The shape of each first edge 316a and that of each second edge 316b are determined depending upon the demands of the designer. However, the above mentioned is not shown in the figures.

Here, it must be emphasized that, each first edge 316a may have a serrated shape or a wavy shape (not shown), each second edge 316b may also have a serrated shape or a wavy shape (not shown), which is determined depending upon the demands of the designer. In other words, the first surface 312 where each first edge 316a is located may be a folded surface (i.e. corrugated surface), and the second surface 314 where each second edge 316b is located may be a folded surface (i.e. corrugated surface). However, the above mentioned is not shown in the figures.

To sum up, the heat-dissipating module of the present invention at least has the following advantages.

Firstly, since the first surface is not coincided with the second surface, the air current may smoothly pass through the first surface and the second surface and then pass by the fins when the heat-dissipating module of the present invention operates. In other words, the air current firstly passes by the first edge of each fin, and then passes by the second edge of each fin. Therefore, when the heat-dissipating module of the present invention operates, the turbulence phenomenon at the first surface is reduced, such that the noise caused by the turbulence is lowered.

Secondly, unlike the conventional heat-dissipating module, it is unnecessary to reduce the size of the fan of the heat-dissipating module of the present invention and to completely reduce the length of each fin of the heat-dissipating module of the present invention. Therefore, the heat-dissipating capacity of the heat-dissipating module of the present invention may be good.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat-dissipating module, suitable for dissipating heat generated by a heat-generating element, comprising:
   a fan, for generating an air current;
   a plurality of fins, wherein each fin has a first edge facing the fan and a second edge facing the fan, the first edges are located on a first surface, the second edges are located on a second surface not coinciding with the first surface, so that each fin's first edge and second edge construct a profile that has a recess of same depth from the first surface to the second surface and the air current passing through the fins from the recess; and
   a heat pipe, having a first end thermally coupled to the heat-generating element, and a second end thermally coupled to the fins outside said recess.

2. The heat-dissipating module as claimed in claim 1, wherein each first edge has a regular shape.

3. The heat-dissipating module as claimed in claim 2, wherein each first edge has a straight shape.

4. The heat-dissipating module as claimed in claim 1, wherein each second edge has a regular shape.

5. The heat-dissipating module as claimed in claim 4, wherein each second edge has a straight shape.

6. The heat-dissipating module as claimed in claim 1, further comprising a heat-conducting element thermally coupled to the heat-generating element, wherein the first end of the heat pipe is thermally coupled to the heat-conducting element.

7. The heat-dissipating module as claimed in claim 1, further comprising a casing having an accommodating space and an outlet, wherein the fan is disposed in the accommodating space, the outlet corresponds to the first surface and the second surface, and the air current passes through the outlet.

8. The heat-dissipating module as claimed in claim 1, wherein the second end of the heat pipe penetrates through the fins.

* * * * *